(12) United States Patent
Imaeda et al.

(10) Patent No.: US 12,249,454 B2
(45) Date of Patent: Mar. 11, 2025

(54) INDUCTOR COMPONENT AND METHOD FOR MANUFACTURING INDUCTOR COMPONENT

(71) Applicant: Murata Manufacturing Co., Ltd., Kyoto-fu (JP)

(72) Inventors: Hiroki Imaeda, Nagaokakyo (JP); Yoshimasa Yoshioka, Nagaokakyo (JP); Kazuyuki Yamamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 961 days.

(21) Appl. No.: 17/330,282

(22) Filed: May 25, 2021

(65) Prior Publication Data

US 2021/0375534 A1 Dec. 2, 2021

(30) Foreign Application Priority Data

Jun. 1, 2020 (JP) .................................. 2020-095489

(51) Int. Cl.
*H01F 27/32* (2006.01)
*H01F 27/02* (2006.01)
(Continued)

(52) U.S. Cl.
CPC ......... *H01F 27/327* (2013.01); *H01F 27/027* (2013.01); *H01F 27/2823* (2013.01);
(Continued)

(58) Field of Classification Search
CPC .. H01F 27/327; H01F 27/027; H01F 27/2823; H01F 27/292; H01F 27/324; H01F 41/046; H05K 1/16
See application file for complete search history.

(56) References Cited

U.S. PATENT DOCUMENTS

2014/0009254 A1* 1/2014 Ohkubo ............. H01F 17/0033
336/192
2017/0084376 A1* 3/2017 Kubota ............... H01F 17/0006
(Continued)

FOREIGN PATENT DOCUMENTS

CN 106463239 A 2/2017
JP 2003-224216 A 8/2003
(Continued)

*Primary Examiner* — Malcolm Barnes
(74) *Attorney, Agent, or Firm* — Studebaker Brackett PLLC

(57) ABSTRACT

An inductor component includes a main body including a magnetic layer, an inductor wiring disposed in the main body, and vertical wirings each of which is connected to the inductor wiring and each of which extends from a portion in which the vertical wiring and the inductor wiring are connected to each other to a first main surface of the main body. A second main surface of the main body is located on the side of the inductor wiring that is opposite to the side of the inductor wiring on which the first main surface is located. The first main surface is covered with a first outer layer having an insulating property, and the second main surface is covered with a second outer surface having an insulating property. The first outer layer and the second outer layer each contain a colorant.

18 Claims, 9 Drawing Sheets

(51) Int. Cl.
  *H01F 27/28* (2006.01)
  *H01F 27/29* (2006.01)
  *H01F 41/04* (2006.01)
  *H05K 1/16* (2006.01)

(52) U.S. Cl.
  CPC ......... *H01F 27/292* (2013.01); *H01F 27/324* (2013.01); *H01F 41/046* (2013.01); *H05K 1/16* (2013.01)

(56) References Cited

U.S. PATENT DOCUMENTS

| | | | |
|---|---|---|---|
| 2017/0200554 A1* | 7/2017 | Kudo | H01F 27/36 |
| 2018/0075965 A1* | 3/2018 | Yoshioka | H01F 27/2823 |
| 2018/0305509 A1* | 10/2018 | Yun | G02B 1/04 |
| 2019/0244743 A1* | 8/2019 | Hirai | H01F 41/12 |

FOREIGN PATENT DOCUMENTS

| | | |
|---|---|---|
| JP | 2008235762 A * | 10/2008 |
| JP | 6024243 B2 | 11/2016 |
| JP | 2017-123406 A | 7/2017 |
| JP | 2018-184582 A | 11/2018 |
| JP | 2019-046993 A | 3/2019 |
| WO | 2016/013643 A1 | 1/2016 |

\* cited by examiner

INDUCTOR COMPONENT AND METHOD FOR MANUFACTURING INDUCTOR COMPONENT

CROSS-REFERENCE TO RELATED APPLICATION

This application claims benefit of priority to Japanese Patent Application No. 2020-095489, filed Jun. 1, 2020, the entire content of which is incorporated herein by reference.

BACKGROUND

Technical Field

The present disclosure relates to an inductor component and a method for manufacturing an inductor component.

Background Art

Japanese Patent No. 6024243 describes an example of an inductor component that includes a main body including a magnetic layer and an inductor wiring disposed in the main body. The main body has a first main surface and a second main surface, and the second main surface is located on the side of the inductor wiring that is opposite to the side of the inductor wiring on which the first main surface is located. In addition, in the main body, a first vertical wiring that extends from a portion in which the first vertical wiring and the inductor wiring are connected to each other to the first main surface and a second vertical wiring that extends from a portion in which the second vertical wiring and the inductor wiring are connected to each other to the second main surface are provided.

Note that, in the inductor component, the side surfaces of the main body including the first main surface and the second main surface are covered with an outer layer having an insulating property.

SUMMARY

In an inductor component such as that mentioned above, the surface of an outer layer covering a main body may sometimes be ground. In this case, grinding marks, which are scratches caused by grinding, may sometimes remain on the surface of the outer layer. If irregularly shaped scratches such as grinding marks remain on the surface, there is a possibility that the accuracy of appearance inspection that is performed in the manufacture of the inductor component or at the time of mounting the inductor component may deteriorate.

An inductor component according to a preferred embodiment of the present disclosure includes a main body that includes a magnetic layer and that has a first main surface and a second main surface, an inductor wiring that is disposed in the main body, and a vertical wiring that is connected to the inductor wiring and that extends from a portion in which the vertical wiring and the inductor wiring are connected to each other to the first main surface. The second main surface is located on a side of the inductor wiring that is opposite to a side of the inductor wiring on which the first main surface is located. The first main surface is covered with a first outer layer having an insulating property, and the second main surface is covered with a second outer layer having an insulating property. The first outer layer and the second outer layer each contain a colorant.

In the above-described configuration, the first outer layer covering the first main surface of the main body and the second outer layer covering the second main surface of the main body each contains the colorant. Thus, when the first outer layer or the second outer layer is subjected to a treatment such as grinding, even if irregularly shaped marks remain on the surface of the outer layer, the marks are less likely to be noticeable. As a result, such scratches are less likely to affect the accuracy of appearance inspection that is performed in the manufacture of the inductor component or at the time of mounting the inductor component.

A manufacturing method according to another preferred embodiment of the present disclosure is a method for manufacturing an inductor component in which an inductor wiring is disposed in a main body including a magnetic layer. This manufacturing method includes a step of forming the inductor wiring, a step of forming a vertical wiring such that the vertical wiring is connected to the inductor wiring, a step of forming the main body such that the inductor wiring and the vertical wiring are arranged in the main body and such that the vertical wiring extends to a first main surface of the main body, a step of forming a first outer layer that has an insulating property and contains a colorant onto the first main surface, and a step of forming a second outer layer that has an insulating property and contains a colorant onto a second main surface of the main body. The second main surface is a main surface of the main body located on a side of the inductor wiring that is opposite to a side of the inductor wiring on which the first main surface is located.

According to an inductor component manufactured by the above-described manufacturing method, advantageous effects equivalent to those of the above-described inductor component can be obtained.

According to the above-described inductor component and the above-described method for manufacturing an inductor component, deterioration in the accuracy of appearance inspection that is performed in the manufacture of an inductor component or at the time of mounting the inductor component can be suppressed.

Other features, elements, characteristics and advantages of the present disclosure will become more apparent from the following detailed description of preferred embodiments of the present disclosure with reference to the attached drawings.

DETAILED DESCRIPTION

Figure 1:
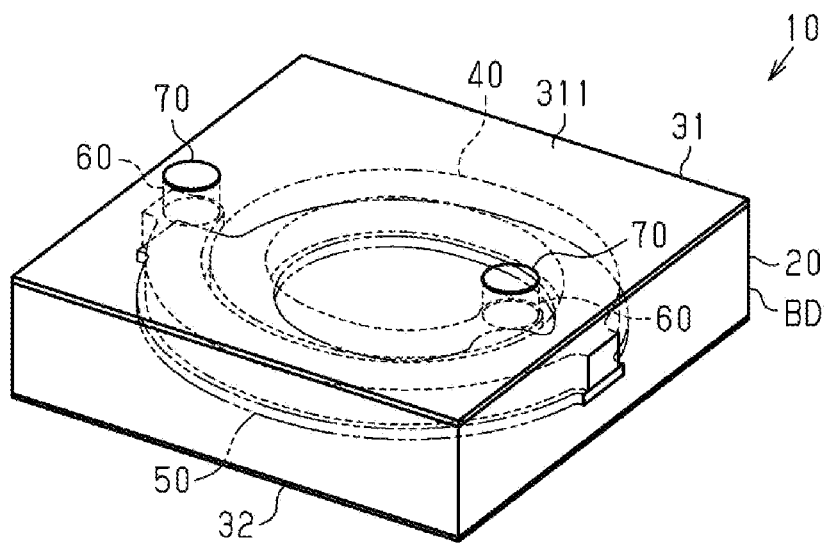
FIG. 1 is a perspective view schematically illustrating an inductor component according to an embodiment of the present disclosure.

An inductor component according to an embodiment of the present disclosure and a method for manufacturing an inductor component according to another embodiment will be described below with reference to FIG. 1 to FIG. 18. Note that some components may be illustrated in an enlarged manner in the drawings for ease of understanding. The dimensional ratios of the components may sometimes be different from the dimensional ratios of actual components or may sometimes differ between the drawings. In addition, although components are illustrated by hatching in the sectional views, the hatching may sometimes be omitted for some of the components for ease of understanding.

As illustrated in FIG. 1, a main body BD of an inductor component 10 includes a magnetic layer 20 made of a magnetic material. The magnetic layer 20 contains magnetic powder. It is preferable that the average particle diameter of the magnetic powder contained in the magnetic layer 20 be "about 1 μm" or more and "about 5 μm" or less (i.e., from about 1 μm to about 5 μm). The term "average particle diameter" refers to, for example, a median diameter "D50".

An example of a method for measuring the average particle diameter is as follows. In the cross section passing through the center of the main body BD such as that illustrated in FIG. 3, cross-sectional images of the magnetic layer 20 containing 30 or more magnetic powder particles are obtained at three different positions. The cross-sectional images are obtained by using a scanning electron microscope (SEM) at an appropriately adjusted magnification (e.g., about 1,000 times). Then, the diameters of the magnetic powder particles are calculated as values converted from the areas of the particles from the images. The particle diameter that is a median value (cumulative value of 50%) among the particle diameters sorted in ascending order is set to be the average particle diameter.

The magnetic layer 20 is made of, for example, a resin containing metal magnetic powder. In the case where the magnetic layer 20 is made of a resin containing metal magnetic powder, it is preferable that the magnetic layer 20 contain at least one of iron and an alloy containing iron as the metal magnetic powder.

Alternatively, the magnetic layer 20 may contain metal magnetic powder that is not an iron-based metal such as iron and an alloy containing iron. Examples of metal magnetic powder that is not an iron-based metal include nickel, chromium, copper, aluminum, and alloys containing these metals. Note that, in the case where the magnetic layer 20 contains metal magnetic powder that is not an iron-based metal, the magnetic layer 20 may also contain an iron-based metal magnetic powder or may not contain an iron-based metal magnetic powder.

It is preferable that the magnetic layer 20 contain "60 wt %" or more of metal magnetic powder with respect to its total weight. In order to improve a filling property of the resin containing metal magnetic powder, it is further preferable that the resin contain two or three types of metal magnetic powders with different particle size distributions.

An example of a resin containing metal magnetic powder is a resin material such as an epoxy resin. Considering an insulating property and formability, it is preferable to use a polyimide resin, an acrylic resin, or a phenolic resin as the resin.

Note that the magnetic layer 20 may be made of a resin that contains a ferrite powder instead of a metal magnetic powder or may be made of a resin that contains both a metal magnetic powder and a ferrite powder. In addition, for example, the magnetic layer 20 may be a substrate made of a ferrite powder hardened by sintering, that is, a ferrite sintered compact.

In the case illustrated in FIG. 1, the main body BD has a substantially rectangular parallelepiped shape. The shape of the main body BD is not limited to a substantially rectangular parallelepiped shape and may be, for example, a substantially columnar shape or a substantially polygonal shape. Among the side surfaces of the main body BD, the top surface of the main body BD in FIG. 3 will be referred to as a "first main surface 21". Among the side surfaces of the main body BD, another main surface of the main body BD that is located on the side of an inductor wiring 40 (described later) opposite to the side of the inductor wiring 40 on which the first main surface 21 is located will be referred to as a "second main surface 22". A portion of the side surfaces of the main body BD excluding the first main surface 21 and the second main surface 22 will be referred to as a "non-main surface 23". In other words, the side surfaces of the main body BD include the first main surface 21, the second main surface 22, and the non-main surface 23.

Figure 3:
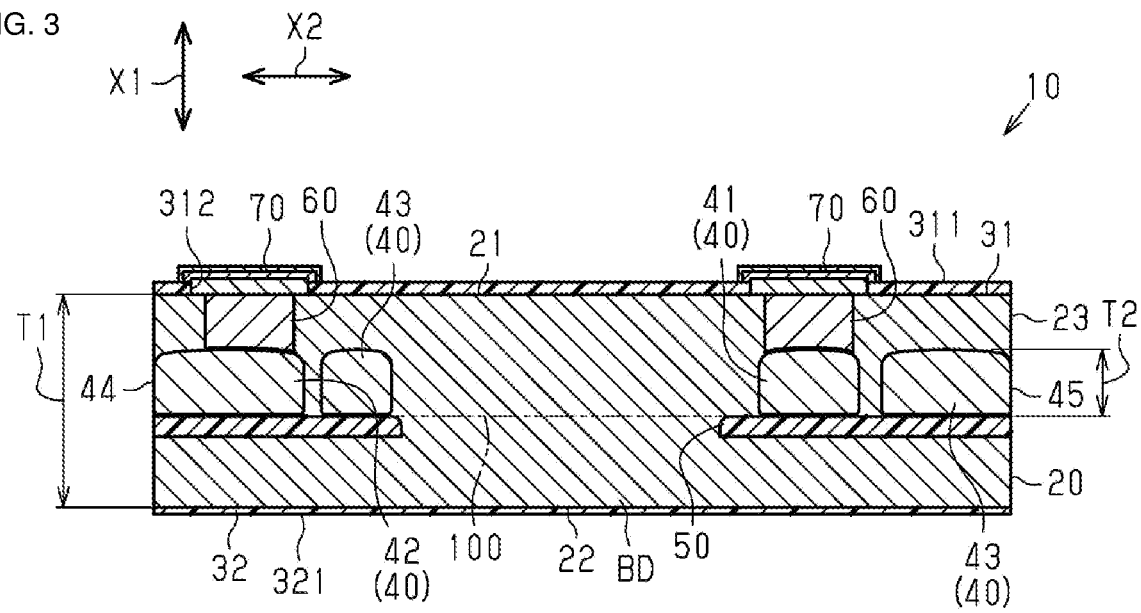
FIG. 3 is a cross-sectional view of the inductor component.

As illustrated in FIG. 3, when the vertical direction in FIG. 3 that is a direction perpendicular to the first main surface 21 is referred to as a thickness direction X1, and a dimension of the main body BD in the thickness direction X1 is referred to as a thickness T1 of the main body BD, the thickness T1 of the main body BD is "about 0.15 mm" or more and "about 0.3 mm" or less (i.e., from about 0.15 mm to about 0.3 mm). In other words, the gap between the first main surface 21 and the second main surface 22 is "about 0.15 mm" or more and "about 0.3 mm" or less (i.e., from about 0.15 mm to about 0.3 mm). For example, in the cross section of the main body BD illustrated in FIG. 3, the average value of the thicknesses of the main body BD measured at three positions, which are the center and the two ends of the main body BD in the longitudinal direction of the main body BD, is derived as the thickness T1 of the main body BD.

As mentioned above, the inductor component 10 is very thin. For example, the aspect ratio that is a value obtained by dividing the thickness T1 of the main body BD by the area of a surface (the upper surface in FIG. 3) of the first main surface 21 is less than "about 0.5". For example, when the length of the first main surface 21 in the transverse direction in FIG. 3 is "about 1.2 mm", and the length of the first main surface 21 in a direction perpendicular to the plane in FIG. 3 is "about 0.6 mm", the surface area of the first main surface 21 is "about 0.72 mm$^2$". Thus, by setting the thickness T1 of the main body BD to "about 0.15 mm" or more and "about 0.3 mm" or less (i.e., from about 0.15 mm to about 0.3 mm), the aspect ratio can be set to less than "about 0.5".

As illustrated in FIG. 1 and FIG. 3, the inductor component 10 includes a first outer layer 31 that has an insulating property and that covers the first main surface 21 of the main body BD, and a second outer layer 32 that has an insulating property and that covers the second main surface 22. In the present embodiment, among the side surfaces of the main body BD, only the first main surface 21 is covered with the first outer layer 31. However, the first outer layer 31 does not cover portions of the first main surface 21 at which vertical wirings 60 are exposed and the peripheral portions. Among the side surfaces of the main body BD, only the second main surface 22 is covered with the second main surface 22. In other words, the portion of the side surfaces of the main body BD excluding the first main surface 21 and the second main surface 22, that is, the non-main surface 23, is not covered with an insulating layer. That is to say, the non-main surface 23 of the magnetic layer 20 is exposed to the outside.

In the main body BD, the inductor wiring 40 and an insulating layer 50 that is in contact with the inductor wiring 40 are arranged. The insulating layer 50 is disposed on the side of the inductor wiring 40 that is opposite to the side of the inductor wiring 40 on which the first main surface 21 is present. The insulating layer 50 is positioned further inside than the second main surface 22 in the thickness direction X1, and the insulating layer 50 is positioned between a portion of the magnetic layer 20 that forms the second main surface 22 and the inductor wiring 40.

The insulating layer 50 is a non-magnetic insulator. The insulating property of the insulating layer 50 is higher than that of the magnetic layer 20. The insulating layer 50 contains, for example, a polyimide resin, an acrylic resin, an epoxy resin, a phenolic resin, or a liquid crystal polymer. In order to improve the insulating performance of the insulating layer 50, the insulating layer 50 may contain an insulating filler such as a silica filler. Note that the term "non-magnetic insulator" in the present embodiment refers to an insulator that contains a material having a specific resistance of "about 1 MΩ·cm" or more and a relative magnetic permeability of "about 1".

The inductor component 10 includes the plurality of vertical wirings 60 that are connected to the inductor wiring 40 and a plurality of external terminals 70 that are arranged on the first main surface 21. In the present embodiment, the number of external terminals 70 arranged on the first main surface 21 is the same as the number of the vertical wirings 60. Each of the vertical wirings 60 is disposed in the main body BD and extends from a portion in which the vertical wiring 60 and the inductor wiring 40 are connected to each other toward the first main surface 21. In addition, each of the vertical wirings 60 is connected to only a corresponding one of the external terminals 70. In other words, each of the vertical wirings 60 has the two ends one of which is connected to the inductor wiring 40 and the other of which is connected to the corresponding external terminal 70. Note that the external terminals 70 are exposed to the outside of the inductor wiring 40.

The inductor wiring 40 will now be described.

Figure 4:
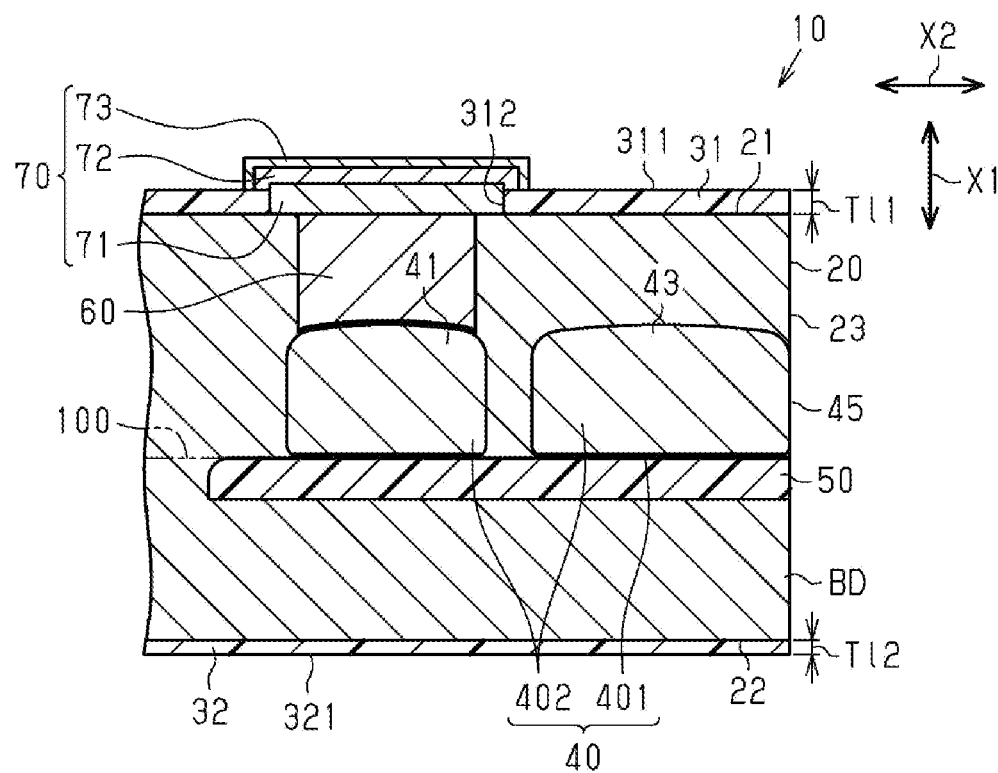
FIG. 4 is an enlarged cross-sectional view of a portion of the inductor component.

The inductor wiring 40 is made of an electrically conductive material. The inductor wiring 40 contains, for example, at least one of copper, silver, gold, and aluminum as the electrically conductive material. Alternatively, for example, the inductor wiring 40 may contain, as the electrically conductive material, an alloy containing at least two of copper, silver, gold, and aluminum. In the present embodiment, as illustrated in FIG. 4, the inductor wiring 40 includes a wiring seed layer 401 that is a seed layer in contact with the insulating layer 50 and an electrically conductive layer 402 that is located on the side of the wiring seed layer 401 that is opposite to the side of the wiring seed layer 401 on which the insulating layer 50 is located. The wiring seed layer 401 contains copper as an example of an electrically conductive material. When a portion of the wiring seed layer 401 that has the largest dimension in the thickness direction X1 is referred to as a largest-dimension portion, and the dimension of the largest-dimension portion in the thickness direction X1 is the thickness of the wiring seed layer 401, the thickness of the wiring seed layer 401 is "about 30 nm" or more and "about 500 nm" or less (i.e., from about 30 nm to about 500 nm). The electrically conductive layer 402 contains, for example, copper and sulfur. When the electrically conductive layer 402 contains copper and sulfur as mentioned above, for example, in the electrically conductive layer 402, the percentage of copper may be set to "about 99 wt %" or more, and the percentage of sulfur may be set to "about 0.1 wt %" or more and less than "about 1.0 wt %" (i.e., from about 0.1 wt % to about 1.0 wt %). Note that the inductor wiring 40 does not need to include the wiring seed layer 401.

As illustrated in FIG. 3, when the dimension of the inductor wiring 40 in the thickness direction X1 is referred to as a thickness T2 of the inductor wiring 40, the thickness T2 of the inductor wiring 40 is "about 40 μm" or more and "about 55 μm" or less (i.e., from about 40 μm to about 55 μm).

Note that the wiring seed layer 401 may include at least one of a layer containing titanium and a layer containing tungsten as a layer. The wiring seed layer 401 has a multilayer structure as mentioned above, so that the degree of contact between the inductor wiring 40 and the insulating layer 50 can be further improved.

Figure 2:
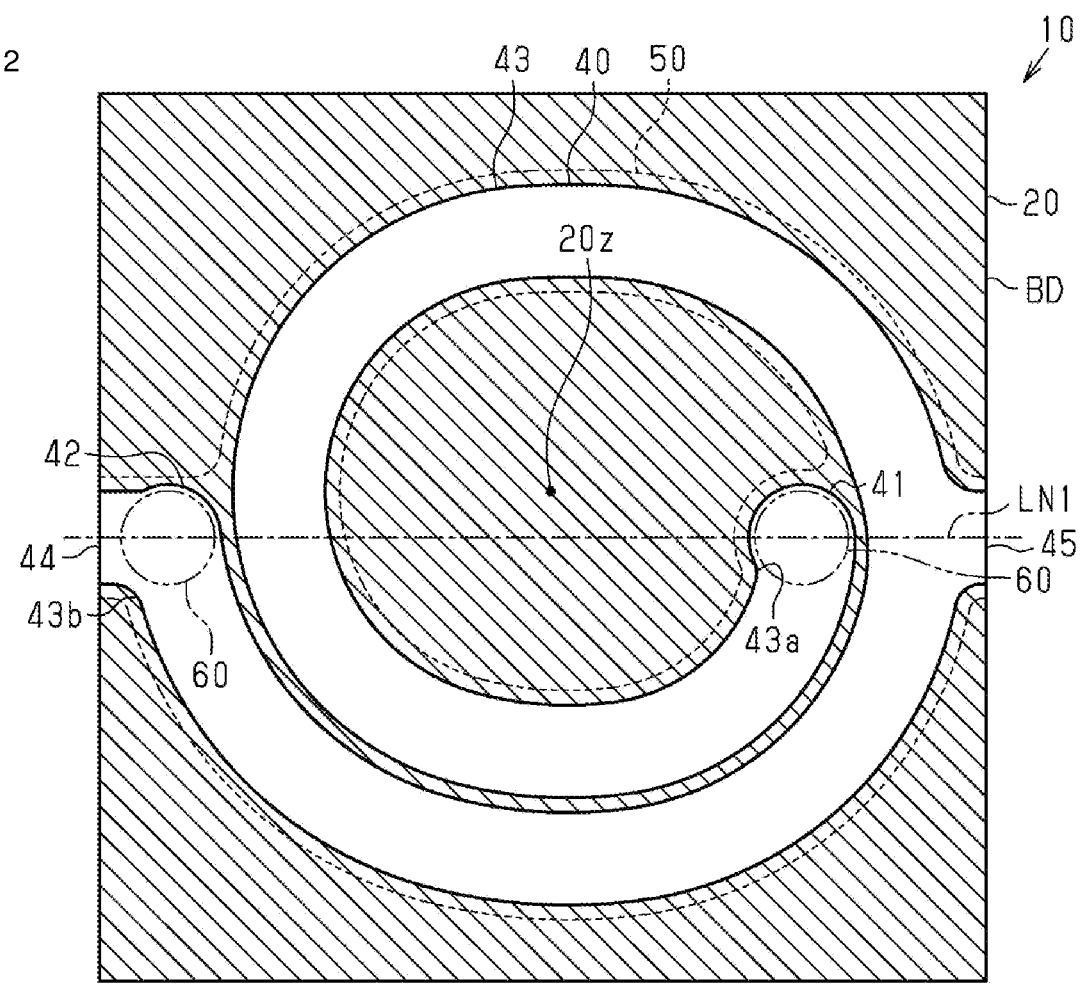
FIG. 2 is a sectional view of the inductor component.

As illustrated in FIG. 2 and FIG. 3, the inductor wiring 40 is provided along a predetermined plane 100 in the main body BD. The predetermined plane 100 is an imaginary plane formed of a portion of the insulating layer 50 that is in surface contact with the inductor wiring 40. Although the predetermined plane 100 is a plane parallel to the first main surface 21 in the present embodiment, an imaginary plane that is not parallel to the first main surface 21 may be the predetermined plane 100. Note that FIG. 3 is a diagram illustrating a cross-sectional view when the inductor component 10 is cut in a direction perpendicular to a line LN1 that is indicated by a one-dot chain line in FIG. 2.

The inductor wiring 40 includes a first pad 41, a second pad 42, and a wiring main body 43 that connects the first pad 41 and the second pad 42 to each other. These pads 41 and 42 are portions of the inductor wiring 40 that are connected to the vertical wirings 60.

FIG. 4 is an enlarged view of a portion of FIG. 3. FIG. 4 illustrates the cross section of the first pad 41 perpendicular to a direction in which the inductor wiring 40 extends from the first pad 41 of the inductor wiring 40. Here, a direction along the cross section and perpendicular to the thickness direction X1 will be referred to as a width direction X2. The width direction X2 is also a direction along the predetermined plane 100.

As illustrated in FIG. 2, on the predetermined plane 100, the wiring main body 43 extends in a spiral manner around a central axis 20z of the main body BD. More specifically, when viewed from the top surface, the wiring main body 43 is wound in a spiral manner in a counterclockwise direction in FIG. 2 starting from an outer peripheral end portion 43b that is positioned on the outer side in the radial direction of the wiring main body 43 to an inner peripheral end portion 43a that is positioned on the inner side in the radial direction.

Here, the number of turns of an inductor wiring is determined on the basis of an imaginary vector. The starting point of the imaginary vector is positioned on an imaginary center line extending in a direction in which the inductor wiring extends and passing through the center of the wiring width of the inductor wiring. In addition, when viewed in the thickness direction X1, the imaginary vector is in contact with the imaginary center line extending in the direction in which the inductor wiring extends. In the case where the starting point of the imaginary vector is placed at one end of the imaginary center line and then is moved to the other end of the imaginary center line, the number of turns is set to "about 1.0 turn" when the angle at which the direction of the imaginary vector is rotated "about 360 degrees". Thus, when the direction of the imaginary vector is rotated, for example, "180 degrees", the number of turns of the inductor wiring is "about 0.5 turns".

In the present embodiment, the direction of the imaginary vector that is imaginarily positioned on the wiring main body 43 of the inductor wiring 40 is rotated "about 540 degrees". Thus, the number of turns of the wiring main body 43, that is, the number of times the wiring main body 43 is wound, is "about 1.5 turns".

The outer peripheral end portion 43b of the wiring main body 43 is connected to the second pad 42. A first dummy wiring 44 that extends along the predetermined plane 100 toward the outer edge of the main body BD is connected to the second pad 42. The first dummy wiring 44 is exposed at the non-main surface 23 of the inductor component 10. Similar to the wiring main body 43 and the second pad 42, the first pad 41 is provided on the predetermined plane 100. The inner peripheral end portion 43a of the wiring main body 43 is connected to the first pad 41.

A second dummy wiring 45 that extends along the predetermined plane 100 toward the outer edge of the main body BD is connected to a portion of the wiring main body 43 between the outer peripheral end portion 43b and the inner peripheral end portion 43a, the portion corresponding to "about 0.5 turns" of the wiring main body 43 from the outer peripheral end portion 43b. The second dummy wiring 45 is exposed at the non-main surface 23 of the inductor component 10.

In the present embodiment, the inductor wiring 40 that is located on the predetermined plane 100 is the only inductor wiring provided in the main body BD. In other words, no inductor wiring is provided on either an imaginary plane located between the top surface of the inductor wiring 40 and the first main surface 21 in FIG. 3 or an imaginary plane that is located between the plane 100 and the second main surface 22. In other words, the inductor wiring 40 that is positioned on the predetermined plane 100 is the only inductor wiring provided in the main body BD. Thus, it can be said that the number of layers of the inductor wiring in the inductor component 10 of the present embodiment is only one.

The external terminals 70 will now be described.

As illustrated in FIG. 3 and FIG. 4, each of the external terminals 70 is in contact with both the main body BD and the first outer layer 31. In other words, the first outer layer 31 has through holes 312 through which the first main surface 21 of the main body BD is exposed to the outside. The external terminals 70 are formed such that the through holes 312 are filled with the external terminals 70. Accordingly, each of the external terminals 70 are in contact with all the first main surface 21, a surrounding wall of one of the through holes 312, and a surface 311 of the first outer layer 31.

Each of the external terminals 70 is a multilayer body formed of a plurality of layers laminated together. In the case illustrated in FIG. 3 and FIG. 4, each of the external terminals 70 is a multilayer body formed of three layers 71, 72, and 73 laminated together. Among the layers 71 to 73, the layer 71 that is located closest to the inductor wiring 40 in the thickness direction X1 is in contact with both the first main surface 21 and the surrounding wall of the corresponding through hole 312.

The multilayer body includes, for example, the following layers.

(A) a layer containing a substitutional catalyst
(B) a layer formed by electroless plating An example of a method for forming a layer containing a substitutional catalyst is a method of bringing a treatment solution containing a substitutional catalyst into contact with portions (magnetic powder) of the magnetic layer 20 that are exposed through the through holes 312 and electroless copper plating layers that are formed on the vertical wirings 60. As a result, a surface portion of the electroless copper plating is replaced with a substitutional catalyst, which is, for example, palladium, and a layer containing a catalyst is formed. After that, by immersing it in a plating solution of electroless nickel plating, an electroless nickel plating layer is formed on the layer containing a substitutional catalyst.

Note that an example of a method that does not use a substitutional catalyst is an alkaline catalyst process method. In the case of using this method, a catalyst (e.g., a lead ion) is also deposited on the first outer layer 31, and a layer containing the catalyst is also formed on the first outer layer 31. Consequently, a layer formed by electroless plating is also formed on the first outer layer 31. Therefore, an unnecessary layer on the first outer layer 31 needs to be removed.

The layer formed by electroless plating is, for example, an electrically conductive layer in which the percentage of copper is "about 99 wt %" or less and the percentage of nickel is "about 0.1 wt %" or more. Here, the term "percentage" refers to the proportion of each material to the weight of the whole layer formed by electroless plating. For example, the percentage of each element can be calculated on the basis of the content of the element in the whole layer formed by electroless plating. More specifically, each percentage can be calculated by performing an ICP analysis on the layer. The term "ICP" is an abbreviation of "inductively coupled plasma".

The first outer layer 31 and the second outer layer 32 will now be described.

As illustrated in FIG. 4, a thickness Tl1 of the first outer layer 31 and a thickness Tl2 of the second outer layer 32 are each smaller than the thickness T1 of the main body BD. For example, the thickness Tl1 of the first outer layer 31 is "about 3 μm" or more and "about 10 μm" or less (i.e., from about 3 μm to about 10 μm). In addition, for example, the thickness Tl2 of the second outer layer 32 is smaller than the thickness Tl1 of the first outer layer 31.

The surface roughness of the first outer layer 31 is, for example, "about 2 μm" or less. In addition, for example, the surface roughness of the second outer layer 32 is "about 2 μm" or less. Here, the term "surface roughness" refers to arithmetic mean roughness "Ra". For example, the arithmetic mean roughness can be derived by measuring the surfaces of the outer layers 31 and 32 with a laser microscope while the viewing angle is set as a predetermined angle. It is preferable that the predetermined angle be, for example, an angle of "about 5 times" or more the average particle diameter of the magnetic powder contained in the magnetic layer 20.

The first outer layer 31 and the second outer layer 32 are each made of a resin. Examples of the resin out of which each of the outer layers 31 and 32 is made include a polyimide resin, an epoxy resin, a phenolic resin, and a liquid crystal polymer. Alternatively, the first outer layer 31 and the second outer layer 32 may each made of a mixture of at least two of a polyimide resin, an epoxy resin, a phenolic resin, and a liquid crystal polymer. In addition, in order to reduce the coefficient of thermal expansion of each of the first outer layer 31 and the second outer layer 32, the first outer layer 31 and the second outer layer 32 may contain an inorganic filler. Examples of an inorganic filler contained in the first outer layer 31 and the second outer layer 32 include silica, barium sulfate, titanium oxide, and alumina powder. Note that each of the first outer layer 31 and the second outer layer 32 does not contain magnetic powder.

Each of the first outer layer 31 and the second outer layer 32 contains a colorant. Each of the first outer layer 31 and the second outer layer 32 may contain pigment, dye, a coloring matter, or the like as a colorant. Examples of shades of colorants include colors each of which is given a color index number. Examples of the colorant contained in each of the first outer layer 31 and the second outer layer 32 include a phthalocyanine-based pigment, colored barium sulfate, titanium oxide, and carbon black. Note that, since the first outer layer 31 and the second outer layer 32 are each a layer having an insulating property, it is preferable that each of the colorants contained in the layers have an insulating property.

In the present embodiment, the color of the first outer layer 31 is different from the color of the second outer layer 32. For example, when the color of the second outer layer 32 is set to be blackish, the color of the first outer layer 31 may be set to be whitish. Even in the case where the outer layers 31 and 32 have similar colors, the color of the first outer layer 31 can be different from the color of the second outer layer 32 also by setting the shade of the first outer layer 31 and the shade of the second outer layer 32 to be different from each other. Here the "color" is determined by hue, saturation, and lightness, which are three attributes of color. In addition, when "the color of the first outer layer 31 is different from the color of the second outer layer 32", at least one of the following conditions (C), (D), and (E) is satisfied.

(C) The hue of the first outer layer 31 is different from the hue of the second outer layer 32.
(D) The saturation of the first outer layer 31 is different from the saturation of the second outer layer 32.
(E) The lightness of the first outer layer 31 is different from the lightness of the second outer layer 32.

For example, it is preferable that the shielding property of the second outer layer 32 be set to be higher than the shielding property of the first outer layer 31. By setting the content of the colorant per unit volume in the second outer layer 32 to be higher than the content of the colorant per unit volume in the first outer layer 31, the shielding property of the second outer layer 32 can be higher than the shielding property of the first outer layer 31. In addition, the shielding property of the second outer layer 32 can be higher than the shielding property of the first outer layer 31 also by setting the color of the second outer layer 32 to be different from the color of the first outer layer 31.

An example of a method for evaluating a shielding property will now be described. In the method, a colored base layer is visually observed or observed by using a stereoscopic microscope under white light through a layer to be evaluated, and the colored base layer is visually observed or observed by using the stereoscopic microscope under white light without the layer to be evaluated. The degree of discoloration of the base layer when it is directly observed and the degree of discoloration of the base layer when it is observed through the layer to be evaluated are obtained. Then, the difference in these degrees of discoloration of the base layer is evaluated as the shielding property of the layer to be evaluated. In the present embodiment, the degree of discoloration of the base layer when the base layer is observed through the first outer layer 31 that is one of evaluation targets is obtained as a first degree of discoloration. The degree of discoloration of the base layer when the base layer is observed through the second outer layer 32 that is the other of the evaluation targets is obtained as a second degree of discoloration. In this case, when the second degree of discoloration is higher than the first degree of discoloration, the shielding property of the second outer layer 32 is higher than the shielding property of the first outer layer 31.

Note that it is preferable that the percentage of the colorant in the first outer layer 31 be set to "about 1 wt %" or more and "about 5 wt %" or less (i.e., from about 1 wt % to about 5 wt %). The denominator in this case is the total weight of the first outer layer 31, that is, the sum of the content of the resin, the content of the filler, and the content of the colorant in the first outer layer 31. In the case where the percentage of the colorant is set to be less than "about 1 wt %", there is a possibility that the color of the first outer layer 31 will be too light. In contrast, in the case where the percentage of the colorant is set to more than "about 5 wt %", there is a possibility that the light transparency of the first outer layer 31 will deteriorate. Assume the case where photolithography is performed in the manufacture of the inductor component 10. In this case, if the light transparency of the first outer layer 31 deteriorates, there is a possibility that the accuracy of patterning will deteriorate, which in turn results in a decrease in the first-pass yield of the inductor component 10. Thus, it is preferable to provide the first outer layer 31 in which the percentage of the colorant is "about 5 wt %" or less onto the first main surface 21, so that the degree of deterioration in the light transparency can be kept within an acceptable range.

For example, the percentage of the colorant can be derived by performing a chemical composition analysis using ICP on the first outer layer 31. In addition, for example, the percentage of the colorant can be checked by capturing images of three or more portions of the first outer layer 31 with a field emission scanning electron microscope (FE-SEM) at a magnification of "about 5,000 times" or more and then performing an EDX analysis. In this case, the total content is defined after excluding a vapor-deposition coating material or a noise component that are used in a preparation process for the FE-SEM observation. An example of the vapor-deposition coating material or the noise component may be platinum. Note that the term "EDX" is an abbreviation of "energy dispersive X-ray spectroscopy".

In the inductor component 10 illustrated in FIG. 1, no terminal is provided on the side on which the second outer layer 32 is present. Accordingly, in the case where photolithography is performed in the manufacture of the inductor component 10, it is not necessary to consider deterioration in the accuracy of the patterning even if the light transparency of the second outer layer 32 is low. Thus, the percentage of the colorant in the second outer layer 32 may be set to be higher than the percentage of the colorant in the first outer layer 31.

For example, in order to improve the shielding property of the second outer layer 32, the second outer layer 32 may contain a black colorant. Examples of the black colorant include carbon black, Ketjenblack, perylene black, titanium oxide, iron oxide, cobalt oxide, anthraquinone, and other black pigments. Alternatively, the second outer layer 32 may contain a plurality of types of colorants having different colors so as to have black color. Note that it is preferable that the specific resistance of the second outer layer 32 be set to "about 10 MΩ·cm" or more.

Advantageous effects of the present embodiment will now be described.

(1) In the manufacture of the inductor component 10 or at the time of mounting the inductor component 10, at least one of the surface of the first outer layer 31 covering the first main surface 21 and the surface of the second outer layer 32 covering the second main surface 22 may sometimes be ground. In this case, grinding marks may sometimes remain on the surface. In addition, in the manufacture of the inductor component 10 or during storage of the inductor component 10, irregularly shaped scratches may sometimes be formed on the surface 311 of the first outer layer 31 or a surface 321 of the second outer layer 32.

In the present embodiment, the first outer layer 31 covering the first main surface 21 and the second outer layer 32 covering the second main surface 22 each contain the colorant. Consequently, even if scratches are formed on the surfaces, it is less likely that the scratches will be noticeable compared with the case where the first outer layer 31 and the second outer layer 32 do not contain a colorant. As a result, the scratches are less likely to affect the accuracy of appearance inspection that is performed in the manufacture of the inductor component 10 or at the time of mounting the inductor component 10.

Here, if the scratches formed on the surface are noticeable, the following situations may occur during the appearance inspection.

In appearance inspection, there is a case where an inspection of the shape and the size of an external terminal exposed at an outer layer is performed. Such an inspection is performed by using an inspection device. Thus, if scratches, such as those mentioned above, are formed near the external terminal, there is a possibility that the inspection device may not be able to accurately measure the shape and the size of the external terminal. Accordingly, there is a possibility that an inductor component will be determined as defective due to the inaccurate measurement of the shape and the size of the external terminal even though the shape and the size are actually appropriate.

In addition, in appearance inspection, there is a case where an inspection of the degree of surface irregularities of the surface of an outer layer is performed. Such an inspection is also performed by using an inspection device. If scratches, such as those mentioned above, are formed on the surface of the outer layer, the inspection device may sometimes consider each of the scratches as one dent and may sometimes determine the degree of surface irregularities of the surface as large. In this case, there is a possibility that an inductor component will be determined as defective as a result of the degree of surface irregularities obtained by the inspection device exceeding an acceptable range even though the actual degree of surface irregularities is within the acceptable range.

Regarding this, in the present embodiment, since scratches formed on the outer layers are unnoticeable, the scratches are less likely to be detected by an inspection device in appearance inspection such as that described above. Thus, deterioration of the inspection accuracy in the appearance inspection can be suppressed.

(2) The color of the first outer layer 31 is set to be different from the color of the second outer layer 32. As a result, when the surface 311 of the first outer layer 31 and the surface 321 of the second outer layer 32 are respectively referred to as a first surface 311 and a second surface 321, the first surface 311 on which the external terminals 70 are arranged and the second surface 321 on which the external terminals 70 are not arranged can be easily distinguished from each other. In addition, the first surface 311 and the second surface 321 do not need to be provided with markers for distinguishing them from each other.

(3) The size of the inductor component 10 generally includes the outer layers covering the side surfaces of the main body BD. Thus, the more number of the side surfaces of the main body BD that are covered by the outer layers, the higher the proportion of the total volume of the outer layers to the volume of the inductor component 10. In other words, the volume of the main body BD needs to be reduced. When the volume of the main body BD is small, the proportion of the magnetic layer 20 in the inductor component 10 is small. As the proportion of the magnetic layer 20 in the inductor component 10 becomes smaller, it is more difficult to increase the inductance of the inductor component 10.

Accordingly, by forming the first outer layer 31 such that the first outer layer 31 covers only the first main surface 21 among the side surfaces of the main body BD, the volume of the main body BD can be larger than that in the case where the non-main surface 23 among the side surfaces of the main body BD, the non-main surface 23 being connected to the first main surface 21, is also covered with the first outer layer 31. As a result, a decrease in the proportion of the magnetic layer 20 in the inductor component 10 can be suppressed, and accordingly, the inductance of the inductor component 10 can be increased.

In addition, by forming the second outer layer 32 such that the second outer layer 32 covers only the second main surface 22 among the side surfaces of the main body BD, the volume of the main body BD can be larger than that in the case where the non-main surface 23 among the side surfaces of the main body BD, the non-main surface 23 being connected to the second main surface 22, is also covered with the second outer layer 32. As a result, a decrease in the proportion of the magnetic layer 20 in the inductor component 10 can be suppressed, and accordingly, the inductance of the inductor component 10 can be increased.

(4) In the case where the first outer layer 31 contains an inorganic filler, the coefficient of thermal expansion of the first outer layer 31 can be reduced, and accordingly, an occurrence of warpage of the inductor component 10 including the first outer layer 31 can be suppressed. In addition, the insulating property of the first outer layer 31 can be improved.

In the case where the second outer layer 32 contains an inorganic filler, the coefficient of thermal expansion of the second outer layer 32 can be reduced, and accordingly, an occurrence of warpage of the inductor component 10 including the second outer layer 32 can be suppressed. In addition, the insulating property of the second outer layer 32 can be improved.

(5) When the thickness T1 of the main body BD is larger than "about 0.3 mm", the size of the inductor component 10 increases, and there is a possibility that the degree of freedom when mounting the inductor component 10 will decrease. Regarding this, in the present embodiment, the thickness T1 is "about 0.3 mm" or less. Thus, a decrease in the degree of freedom when mounting the inductor component 10 can be suppressed while a sufficient strength of the inductor component 10 is ensured.

When the thickness T1 of the main body BD is small, the irregularities formed on the side surfaces of the main body BD are likely to become notable if the particle diameter of the magnetic powder contained in the magnetic layer 20 is large. In other words, when the thickness T1 of the main body BD is "about 0.3 mm" or less, if the average particle diameter of the magnetic powder contained in the magnetic layer 20 is larger than "about 5 μm", the ratio of the particle diameter of the magnetic powder to the thickness T1 of the main body BD increases, and the irregularities formed on the side surfaces of the main body BD are likely to become notable. Accordingly, it is preferable that the average particle diameter of the magnetic powder contained in the magnetic layer 20 be set to "about 1 μm" or more and "about 5 μm" or less (i.e., from about 1 μm to about 5 μm). As a result, an increase in the above-mentioned ratio can be suppressed, and accordingly, the irregularities formed on the side surfaces of the main body BD are less likely to become notable.

In addition, by containing an iron-based magnetic powder as a magnetic powder into the magnetic layer 20, the inductor component 10 can have favorable direct-current superposition characteristics.

Note that, in the case of a thin inductor component whose thickness T1 is "about 0.3 mm" or less, due to the accumulation of variations in the thicknesses of layers that are laminated, the sum of variations in the thickness of the inductor component becomes relatively large with respect to the thickness of the inductor component. Consequently, in order to keep such variations within a certain range, it is necessary to perform a process of grinding at least one of the surface of the first outer layer 31 and the surface of the second outer layer 32 as a process of adjusting the thickness of the inductor component 10 after laminating the layers together.

(6) In the case where the main body BD contains magnetic powder, irregularities are likely to be formed on the first main surface 21. Thus, when the thickness Tl1 of the first outer layer 31 is less than "about 3 μm", the first outer layer 31 is too thin, and irregularities are likely to be formed also on the surface 311 of the first outer layer 31. In other words, the flatness of the surface 311 of the first outer layer 31 is likely to become small. Accordingly, by setting the thickness Tl1 of the first outer layer 31 to "about 3 μm" or more, the flatness of the surface 311 of the first outer layer 31 can be increased, and the degree of surface irregularities of the surface 311 can be reduced.

When the thickness Tl1 of the first outer layer 31 is set to be larger than "about 10 μm", the proportion of the layer that does not contain magnetic powder to the inductor component 10 increases, and this makes it difficult to increase the inductance of the inductor component 10. Accordingly, by setting the thickness Tl1 of the first outer layer 31 to "about 10 μm" or less, an increase in the proportion of the layer that does not contain magnetic powder to the inductor component 10 can be suppressed. As a result, the inductance of the inductor component 10 can be increased.

(7) Since no terminal is provided on the side on which the second outer layer 32 is present, the second outer layer 32 may be formed so as to be thinner than the first outer layer 31. By forming the second outer layer 32 thin in this manner, an increase in the proportion of the layer that does not contain magnetic powder to the inductor component 10 can be suppressed. As a result, the inductance of the inductor component 10 can be increased.

(8) By setting the shielding property of the second outer layer 32 to be higher than the shielding property of the first outer layer 31, scratches formed on the surface 321 of the second outer layer 32 can be made further less noticeable even in the case where the second outer layer 32 is thinner than the first outer layer 31.

(9) By containing a black colorant into the second outer layer 32, the shielding property of the second outer layer 32 can be improved.

(10) By setting the surface roughness of the first outer layer 31 to "about 2 μm" or less, the amount of light that is reflected by the surface 311 of the first outer layer 31 can be stabilized. As a result, deterioration of the inspection accuracy in the appearance inspection such as that described above can be suppressed.

By setting the surface roughness of the second outer layer 32 to "about 2 μm" or less, the amount of light that is reflected by the surface 321 of the second outer layer 32 can be stabilized. As a result, deterioration of the inspection accuracy in the appearance inspection such as that described above can be suppressed.

An example of a method for manufacturing the above-described inductor component 10 will now be described with reference to FIG. 5 to FIG. 18. The manufacturing method in the present embodiment is a method of using a semi-additive process in formation of the inductor wiring 40.

Figure 5:
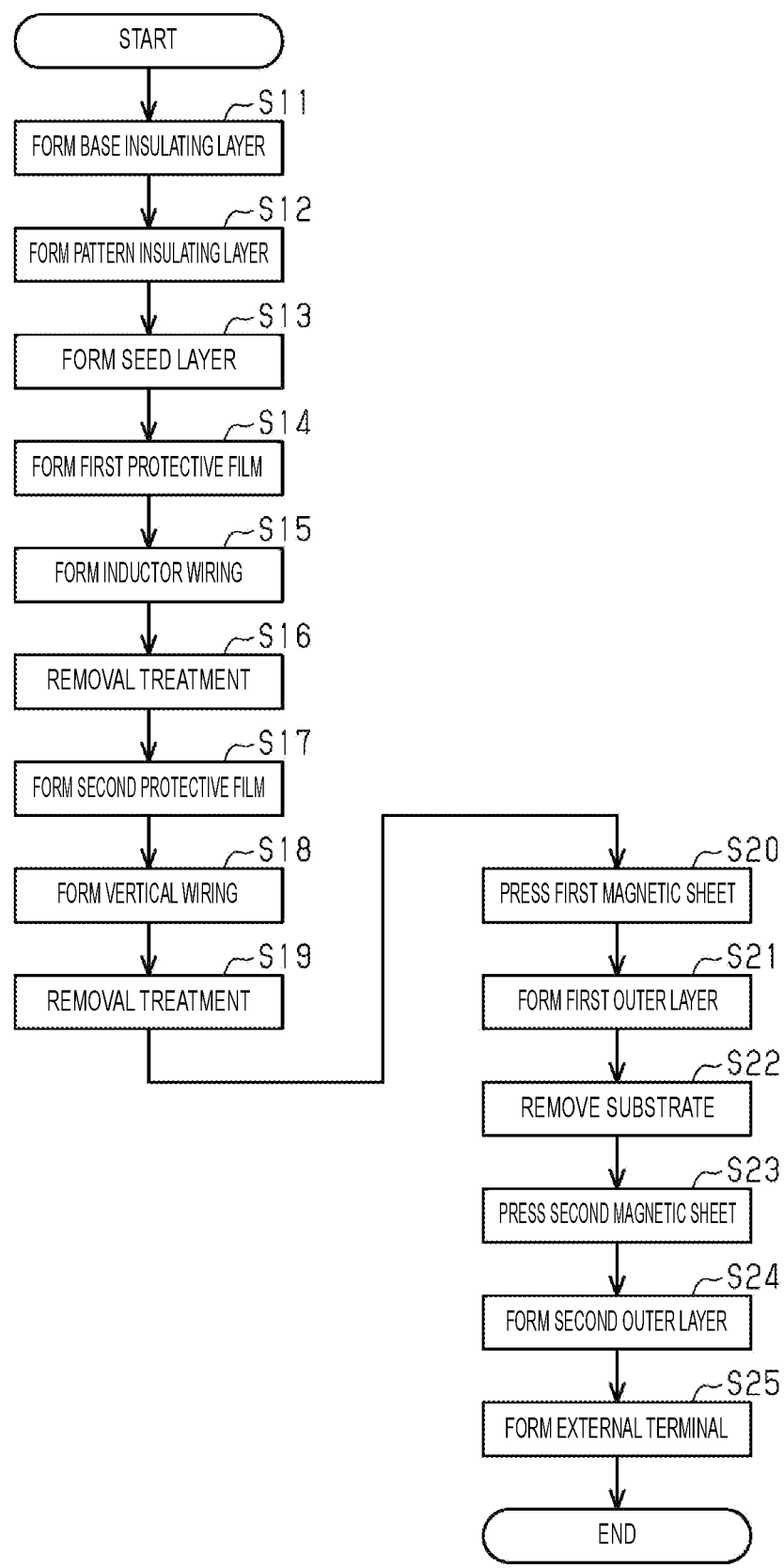
FIG. 5 is a flowchart illustrating a method for manufacturing an inductor component according to another embodiment.
Figure 6:
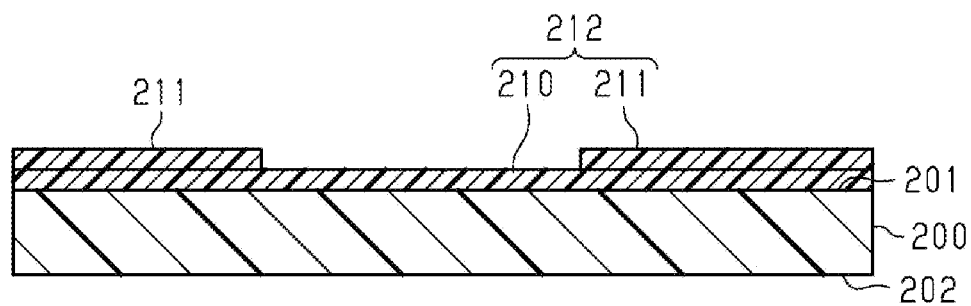
FIG. 6 is a diagram illustrating the manufacturing method.

As illustrated in FIG. 5, in first step S11, a base insulating layer 210 is formed on a substrate 200. As illustrated in FIG. 6, the substrate 200 has a substantially plate-like shape. An example of the material of the substrate 200 is a ceramic. In FIG. 6, the top surface of the substrate 200 and the bottom surface of the substrate 200 will be referred to as a front surface 201 and a rear surface 202, respectively. Then, the base insulating layer 210 is formed on the substrate 200 so as to cover the entire front surface 201 of the substrate 200. The base insulating layer 210 is made of the same non-magnetic material as the insulating layer 50, which is included in the above-described inductor component 10. For example, the base insulating layer 210 can be formed by applying a polyimide varnish containing a trifluoromethyl group and silsesquioxane to the front surface 201 of the substrate 200 by spin coating.

Once formation of the base insulating layer 210 has been completed, the process continues to next step S12. In step S12, as illustrated in FIG. 6, a pattern insulating layer 211 is formed on the base insulating layer 210. In FIG. 6, at least an upper portion of the pattern insulating layer 211 will form the insulating layer 50 of the inductor component 10. For example, a non-magnetic insulating resin is patterned on the base insulating layer 210 by photolithography, so that the pattern insulating layer 211 can be formed. In this case, the pattern insulating layer 211 is formed by using the same type of polyimide varnish used in the formation of the base insulating layer 210.

Figure 7:
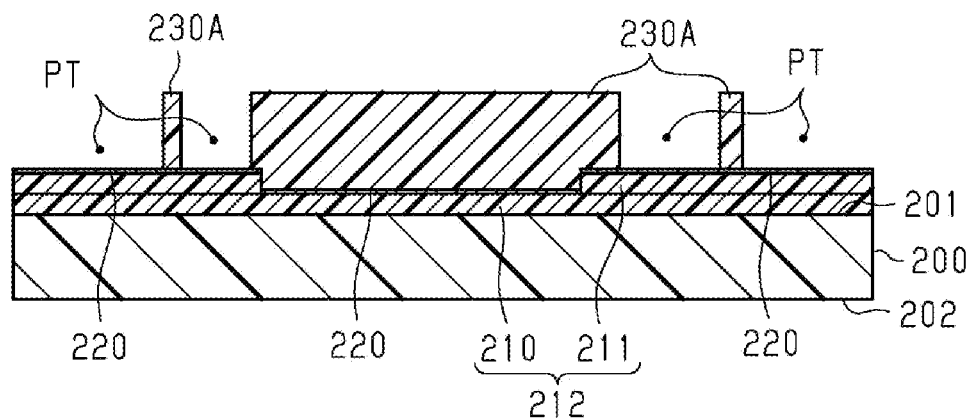
FIG. 7 is a diagram illustrating the manufacturing method.

Once formation of the pattern insulating layer 211 has been completed, the process continues to next step S13. In step S13, a seed layer 220 is formed. In other words, as illustrated in FIG. 7, the seed layer 220 is formed so as to cover the entire top surface of a manufacturing insulating layer 212 including the base insulating layer 210 and the pattern insulating layer 211. For example, the seed layer 220 containing copper is formed by sputtering. For example, in step S13, the seed layer 220 having a thickness of about "200 nm" is formed. A portion of the seed layer 220 that is located on the pattern insulating layer 211 will partially serve as the wiring seed layer 401 included in the inductor wiring 40.

Once formation of the seed layer 220 has been completed, the process continues to next step S14. In step S14, a photoresist is applied to the entire seed layer 220. For example, the photoresist is applied to the seed layer 220 by spin coating. Subsequently, light exposure is performed by using an exposure device. As a result, a portion of the photoresist that corresponds to a position at which the electrically conductive layer 402 is to be formed becomes removable by a development treatment, which will be described later, and the other portions of the photoresist are cured. Note that, in the case where a negative resist is used as the photoresist, a portion of the photoresist that is exposed to light is cured, and the other portions of the photoresist become removable. In contrast, in the case where a positive resist is used as the photoresist, a portion of the photoresist that is exposed to light becomes removable, and the other portions of the photoresist are cured. By controlling a portion of the photoresist that is exposed to light, the portion deposited on the manufacturing insulating layer 212 can be partially cured. Subsequently, as illustrated in FIG. 7, a portion of the photoresist that corresponds to the position at which the electrically conductive layer 402 is to be formed is removed by a development treatment using a developing solution. The cured portion of the photoresist remains as a first protective film 230A on the seed layer 220. By patterning the first protective film 230A on the seed layer 220 in this manner, a wiring pattern PT is formed. The wiring pattern PT has the shape of a cavity that corresponds to the shape of the inductor wiring 40 of the inductor component 10.

Figure 8:
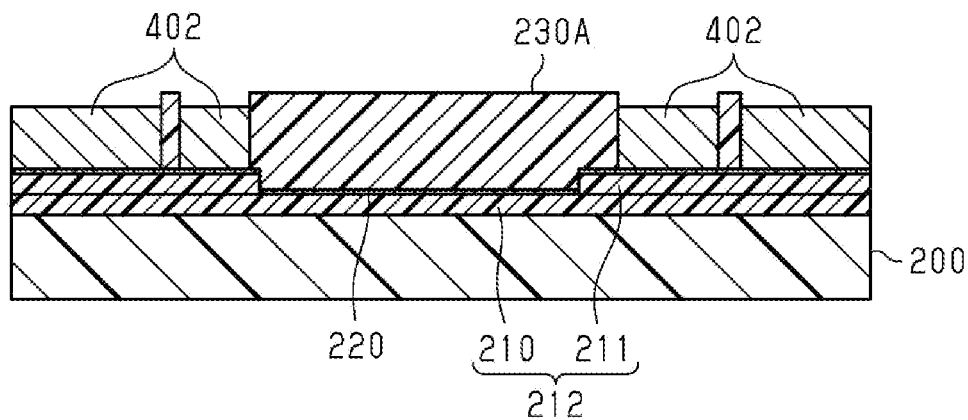
FIG. 8 is a diagram illustrating the manufacturing method.

Once formation of the wiring pattern PT has been completed, the process continues to next step S15. In step S15, the electrically conductive layer 402 such as that illustrated in FIG. 8 is formed by supplying an electrically conductive material into the wiring pattern PT. For example, by performing electrolytic copper plating using an aqueous solution of copper sulfate, copper and a small amount of sulfur are mainly deposited on a portion of the seed layer 220 that is exposed. As a result, the electrically conductive layer 402 is formed. Since an aqueous solution of copper sulfate is used, the electrically conductive layer 402 contains sulfur. A portion of the seed layer 220 with which the electrically conductive layer 402 is in contact and the electrically conductive layer 402 form the inductor wiring 40. In other words, the portion of the seed layer 220 with which the electrically conductive layer 402 is in contact serves as the wiring seed layer 401.

Figure 9:
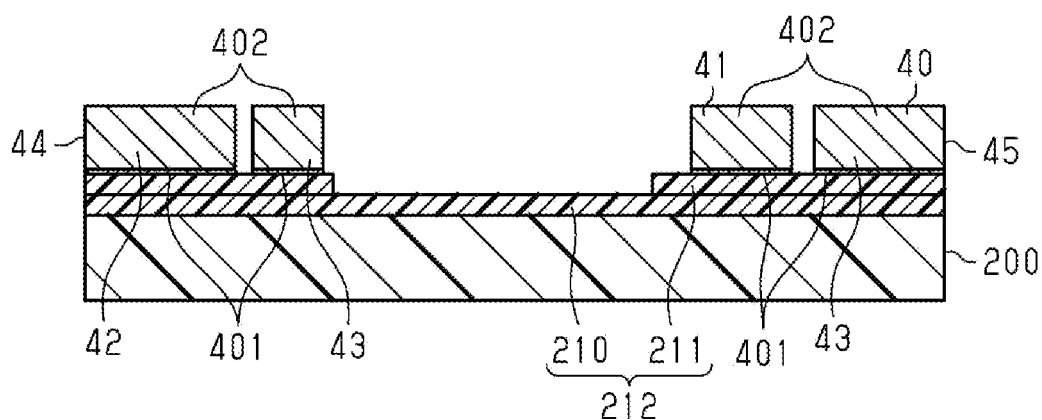
FIG. 9 is a diagram illustrating the manufacturing method.

Once formation of the electrically conductive layer 402 has been completed, the process continues to next step S16. In step S16, as illustrated in FIG. 9, the first protective film 230A is removed by a treatment using a peeling solution.

After removal of the first protective film 230A has been completed, a portion of the seed layer 220 that had been in contact with the first protective film 230A is removed. For example, the portion of the seed layer 220 that had been in contact with the first protective film 230A is removed by wet etching. As a result, only a portion of the seed layer 220 that will serve as the wiring seed layer 401 remains.

Figure 10:
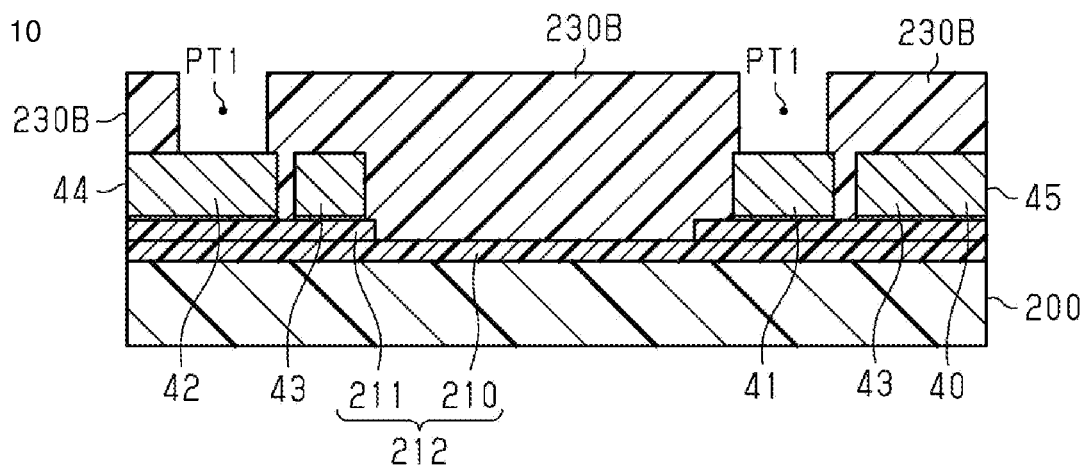
FIG. 10 is a diagram illustrating the manufacturing method.

Once formation of the removal treatment in step S16 has been completed, the process continues to next step S17. In step S17, a photoresist is applied so as to cover the inductor wiring 40. For example, the photoresist is applied by spin coating. Subsequently, light exposure is performed by using an exposure device. As a result, portions of the photoresist that correspond to positions at which the vertical wirings 60 are to be formed become removable by a development treatment, which will be described later, and the other portions of the photoresist are cured. After that, as illustrated in FIG. 10, a portion of the photoresist that is deposited on the pattern insulating layer 211 is removed by a development treatment using a developing solution. In addition, the cured portion of the photoresist remains as a second protective film 230B on the manufacturing insulating layer 212. By patterning the second protective film 230B on the manufacturing insulating layer 212 in this manner, vertical patterns PT1 that are used for forming the vertical wirings 60 are formed.

Figure 11:
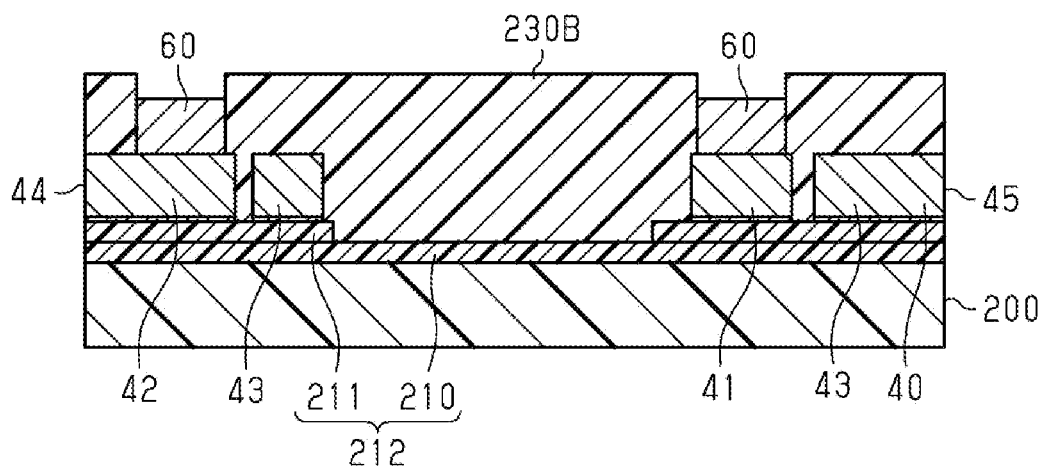
FIG. 11 is a diagram illustrating the manufacturing method.

Once formation of the vertical patterns PT1 has been completed, the process continues to next step S18. In step S18, the vertical wirings 60 are formed as illustrated in FIG. 11. For example, by performing electrolytic copper plating using an aqueous solution of copper sulfate, the vertical wirings 60 can be formed in the vertical patterns PT1. In this case, copper, which is an electrically conductive material, is supplied into the vertical patterns PT1 by supplying power to the inductor wiring 40 via the dummy wirings 44 and 45. In the case of using an aqueous solution of copper sulfate in this manner, each of the vertical wirings 60 contains a small amount of sulfur.

Figure 12:
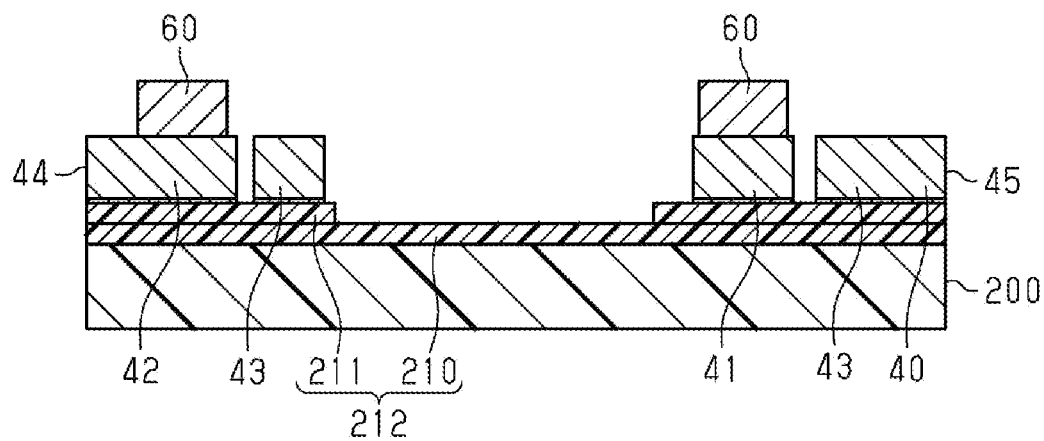
FIG. 12 is a diagram illustrating the manufacturing method.

Once formation of the vertical wirings 60 has been completed, the process continues to next step S19. In step S19, the second protective film 230B is removed by a treatment using a peeling solution as illustrated in FIG. 12.

Figure 13:
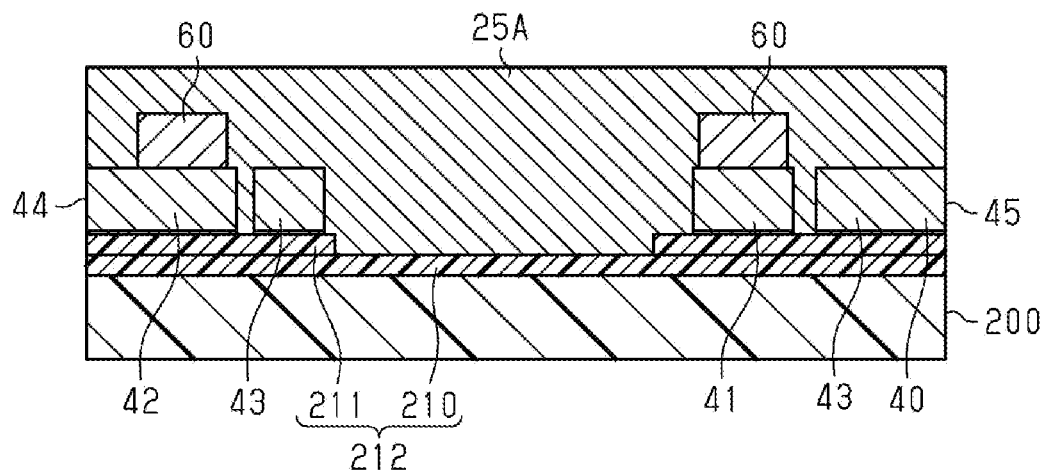
FIG. 13 is a diagram illustrating the manufacturing method.
Figure 14:
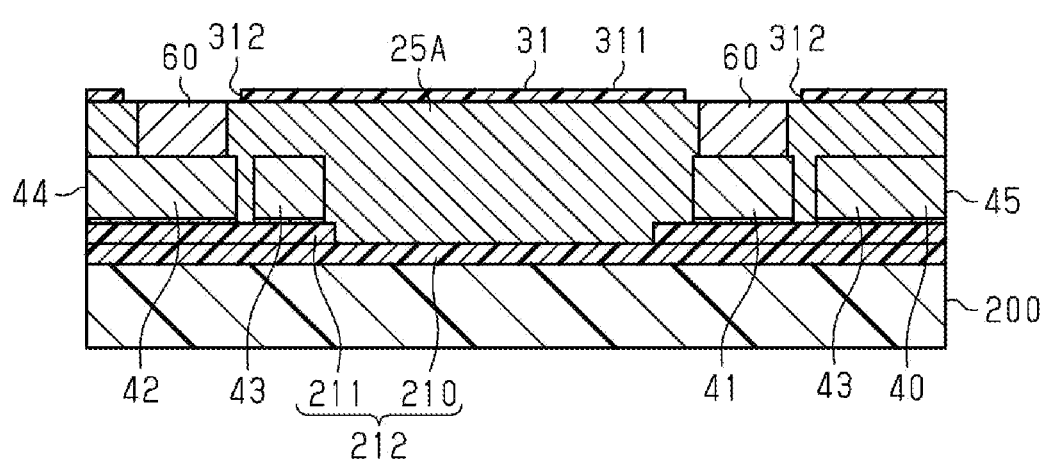
FIG. 14 is a diagram illustrating the manufacturing method.

Once the removal treatment in step S19 has been completed, the process continues to next step S20. In step S20, a first magnetic sheet 25A that is illustrated in FIG. 13 is pressed from above in FIG. 13. As a result, the inductor wiring 40 and the vertical wirings 60 are embedded in the first magnetic sheet 25A. The first magnetic sheet 25A that is pressed from above in FIG. 13 in step S20 may be a single-layer sheet or may be a multilayer body formed of a plurality of layers laminated together. Subsequently, as illustrated in FIG. 14, an upper portion of the first magnetic sheet 25A in FIG. 14 is ground until one of the two ends of each of the vertical wirings 60, the one end not being in contact with the inductor wiring 40, becomes visible from above in FIG. 14.

Once pressing of the first magnetic sheet 25A and grinding of the first magnetic sheet 25A have been completed, the process continues to next step S21. In step S21, as illustrated in FIG. 14, the first outer layer 31 is formed on the top surface of the first magnetic sheet 25A in FIG. 14. In the present embodiment, the first outer layer 31 that contains a colorant is formed. For example, the first outer layer 31 can be formed by applying a non-magnetic insulating resin to the first magnetic sheet 25A. In this state, the first outer layer 31 also covers the vertical wirings 60. Accordingly, the through holes 312 are formed in the first outer layer 31 at positions where the external terminals 70 are to be formed. For example, each of the through holes 312 can be formed by radiating a laser beam onto the first outer layer 31. Note that, when the first outer layer 31 is formed, the first outer layer 31 may be formed by patterning a non-magnetic insulating resin on the first magnetic sheet 25A by photolithography. In this case, the first outer layer 31 having the through holes 312 can be formed by photolithography, and thus, a process of forming each of the through holes 312 by using a laser beam can be omitted.

Figure 15:
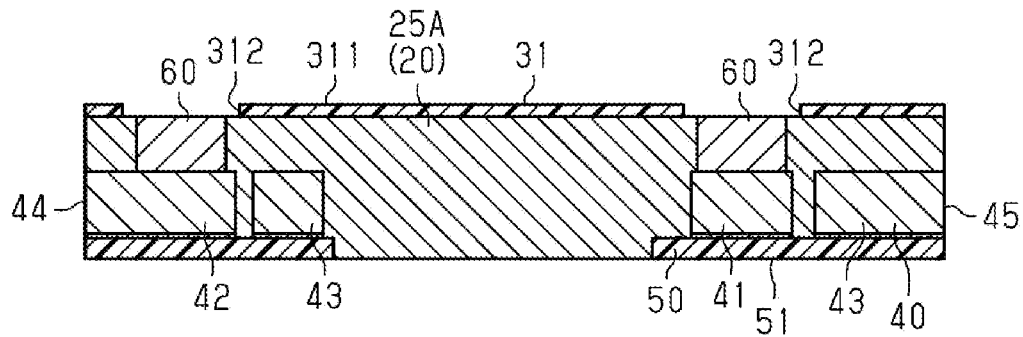
FIG. 15 is a diagram illustrating the manufacturing method.

Once formation of the first outer layer 31 has been completed, the process continues to next step S22. In step S22, as illustrated in FIG. 15, the substrate 200 and the base insulating layer 210 are removed by grinding. In this case, a portion of the pattern insulating layer 211 may be removed. The pattern insulating layer 211 that remains after this treatment serves as the insulating layer 50 of the inductor component 10.

Figure 16:
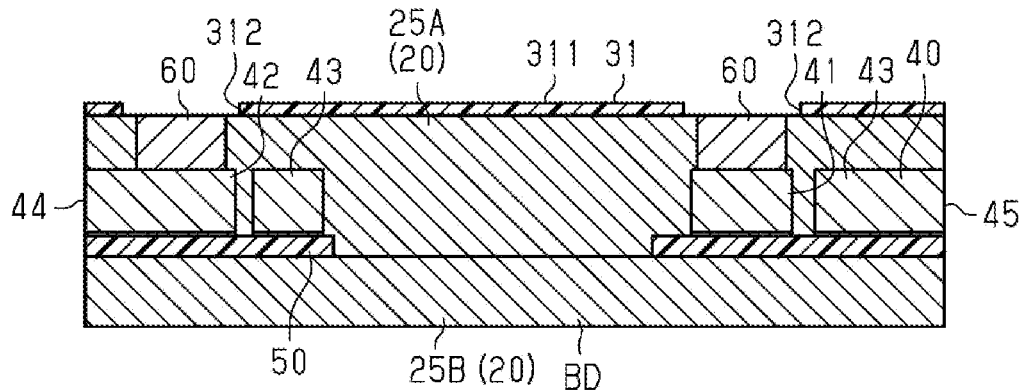
FIG. 16 is a diagram illustrating the manufacturing method.

Once the grinding has been completed, the process continues to next step S23. In step S23, a second magnetic sheet 25B that is illustrated in FIG. 16 is pressed from below in FIG. 16. As a result, the inductor wiring 40 is sandwiched between the first magnetic sheet 25A and the second magnetic sheet 25B. The second magnetic sheet 25B that is pressed from below in FIG. 16 in step S23 may be a single-layer sheet or may be a multilayer body formed of a plurality of layers laminated together. Then, by grinding a lower portion of the second magnetic sheet 25B in FIG. 16, the main body BD of the inductor component 10 is formed.

Figure 17:
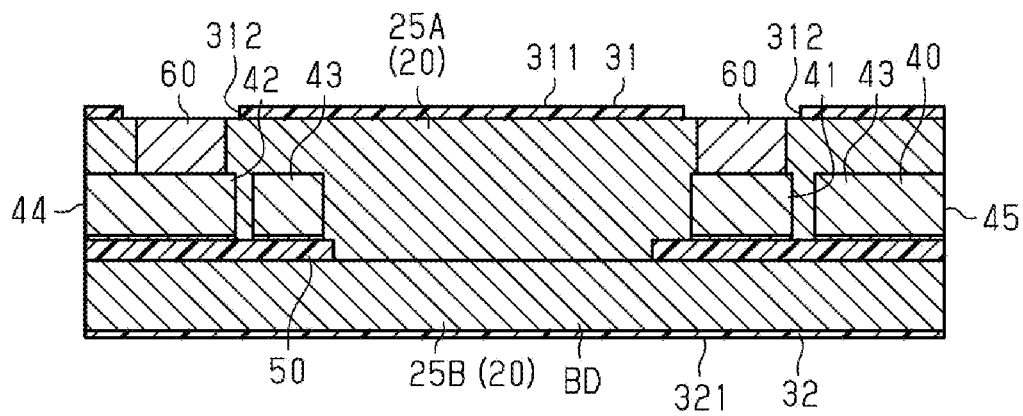
FIG. 17 is a diagram illustrating the manufacturing method.

Once pressing of the second magnetic sheet 25B and grinding of the second magnetic sheet 25B have been completed, the process continues to next step S24. In step S24, as illustrated in FIG. 17, the second outer layer 32 is formed on the bottom surface of the second magnetic sheet 25B in FIG. 17. For example, the second outer layer 32 can be formed by applying a non-magnetic insulating resin to the second magnetic sheet 25B. Note that, in the case of forming a through hole into the second outer layer 32, the through hole may be formed by using a laser beam after the insulating resin has been applied. Alternatively, the second outer layer 32 having a through hole can be formed by patterning a non-magnetic insulating resin on the second magnetic sheet 25B by photolithography.

Figure 18:
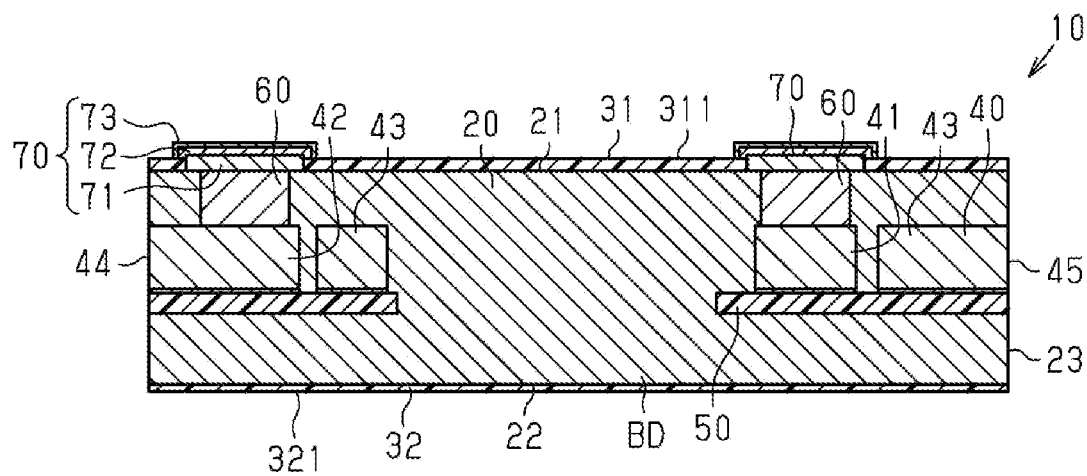
FIG. 18 is a diagram illustrating the manufacturing method.

Once formation of the second outer layer 32 has been completed, the process continues to next step S25. In step S25, the external terminals 70 are formed as illustrated in FIG. 18. As a result, a series of steps of the method for manufacturing the inductor component 10 are completed.

Note that the above-described manufacturing method is an example in the case of manufacturing the inductor components 10 one by one. The method for manufacturing the inductor component 10 is not limited to the above method. For example, portions that are configured to serve as a plurality of inductor components 10 may be arranged in a matrix on the substrate 200, and they may be cut into pieces with, for example, a dicing machine in step S25 and the subsequent steps. In addition, a curing step such as heating may be performed as necessary after application of the non-magnetic insulating resin or after pressing of the magnetic sheets.

Note that, according to a manufacturing method such as that described above, the following advantageous effects can be obtained.

(11) By containing a colorant into each of the first outer layer 31 and the second outer layer 32, the inductor component 10 in which scratches formed on the first outer layer 31 and the second outer layer 32 are less likely to be noticeable can be manufactured. As a result, deterioration of the inspection accuracy in the appearance inspection can be suppressed. Thus, the yield of the inductor component 10 can be stabilized.

The above-described embodiment can be implemented by making modifications in the following manner. The above-described embodiment and the following modifications can be combined and implemented as long as it is technically consistent.

Figure 19:
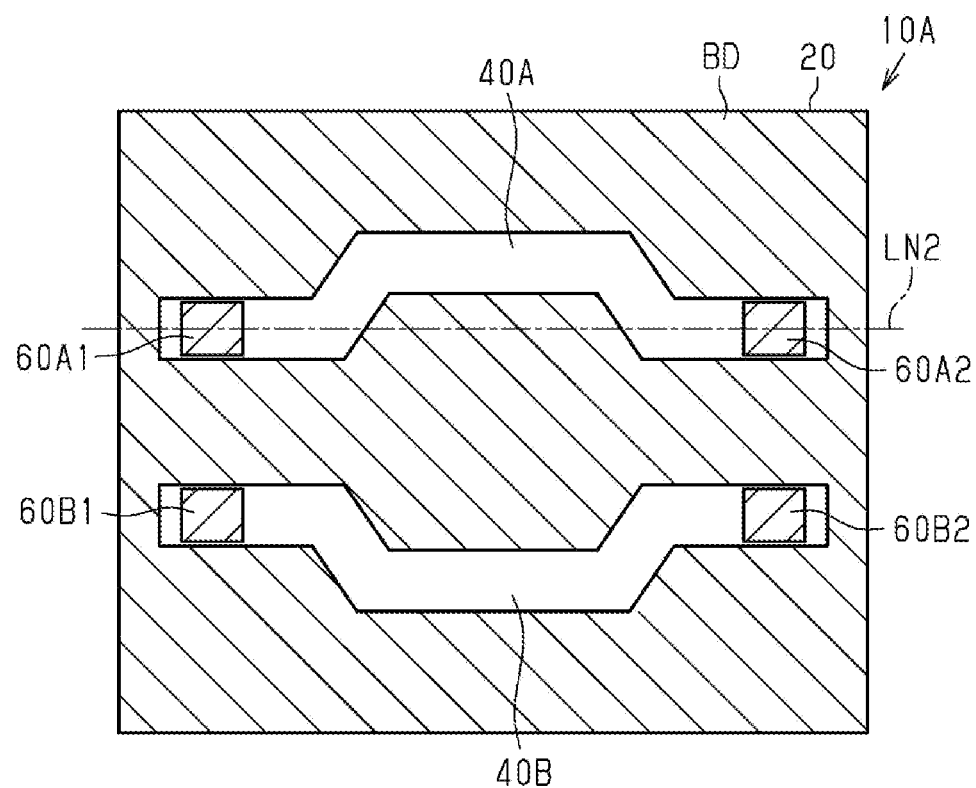
FIG. 19 is a sectional view schematically illustrating an inductor component according to a modification.
Figure 20:
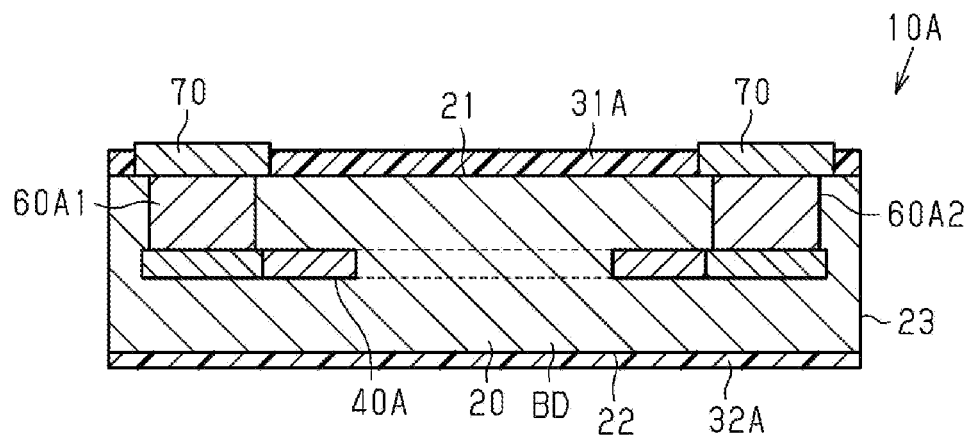
FIG. 20 is a cross-sectional view of the inductor component.

The inductor component may have a configuration in which a plurality of inductor wirings are arranged in the main body BD. FIG. 19 and FIG. 20 each illustrate an inductor component 10A in which a first inductor wiring 40A and a second inductor wiring 40B that are not in contact with each other are arranged in the main body BD. FIG. 20 is a diagram illustrating a cross-sectional view when the inductor component 10A illustrated in FIG. 19 is cut in a direction perpendicular to a line LN2 that is indicated by a one-dot chain line. A vertical wiring 60A1 is connected to a first end portion of the first inductor wiring 40A, which is one of the two inductor wirings 40A and 40B, and a vertical wiring 60A2 is connected to a second end portion of the first inductor wiring 40A. A vertical wiring 60B1 is connected to a first end portion of the second inductor wiring 40B, and a vertical wiring 60B2 is connected to a second end portion of the second inductor wiring 40B. Each of the vertical wirings 60A1, 60A2, 60B1, and 60B2 extends from a portion in which the vertical wiring and a corresponding one of the inductor wirings 40A and 40B are connected to each other to the first main surface 21 of the main body BD. The inductor component 10A includes the external terminals 70, and the number of the external terminals 70 are the same as the number of the vertical wirings extending to the first main surface 21. Each of the vertical wirings 60A1, 60A2, 60B1, and 60B2 is connected to only a corresponding one of the external terminals 70.

The first main surface 21 of the inductor component 10A is covered with a first outer layer 31A. In addition, the second main surface 22 of the inductor component 10A is covered with a second outer layer 32A. Similar to the first outer layer 31 of the inductor component 10 that has been described in the above embodiment, the first outer layer 31A contains a colorant. Similar to the second outer layer 32 of the inductor component 10 that has been described in the above embodiment, the second outer layer 32A contains a colorant.

The inductor wiring may have a shape that is different from the shapes described in the above embodiment and each modification. The structure, the shape, the material, and so forth of the inductor wiring are not particularly limited as long as the inductor wiring can impart an inductance to the inductor component by generating a magnetic flux therearound when a current flows therethrough. The inductor wiring may be a wiring having any one of various known wiring shapes such as a substantially spiral shape having "about 1 turn" or more, a substantially curved shape having less than "about 1.0 turn", and a substantially meandering shape.

Figure 21:
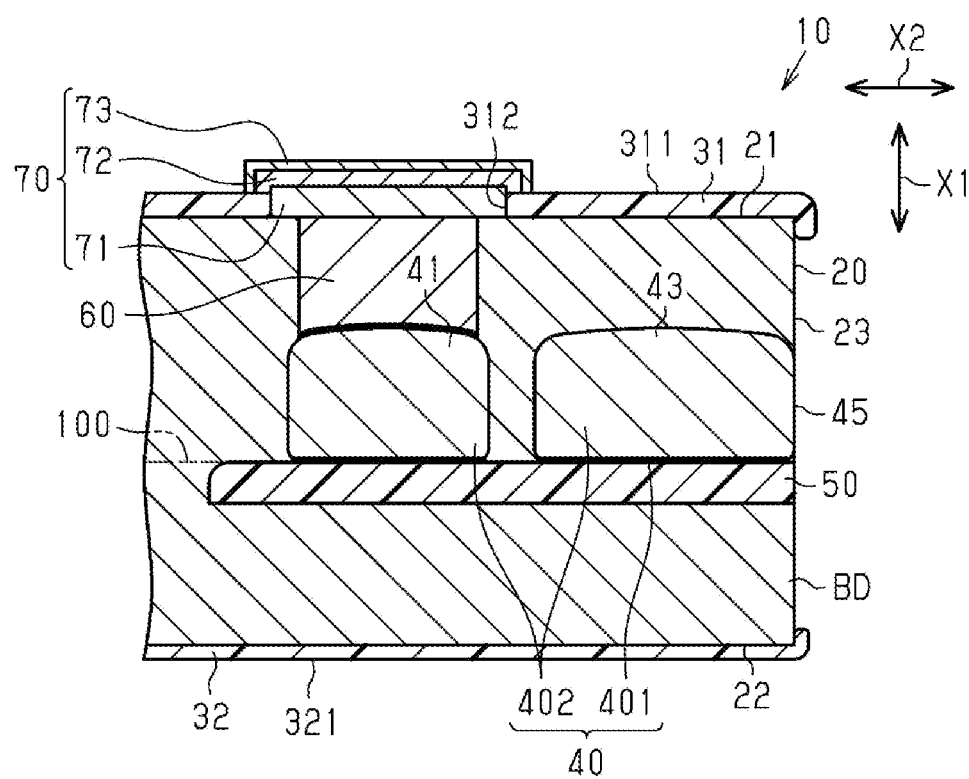
FIG. 21 is an enlarged cross-sectional view of a portion of the inductor component according to the modification.

For example, among the side surfaces of the main body BD of the inductor component 10, a portion of the non-main surface 23 that is connected to the first main surface 21 may also be covered with the first outer layer 31 as illustrated in FIG. 21.

For example, among the side surfaces of the main body BD of the inductor component 10, a portion of the non-main surface 23 that is connected to the second main surface 22 may also be covered with the second outer layer 32 as illustrated in FIG. 21.

In the above-described embodiment, the vertical wirings 60 of the inductor component 10 extend in the thickness direction X1. However, in the inductor component 10, the direction in which the vertical wirings 60 extend may be different from the thickness direction X1.

It is preferable that the multilayer bodies forming the external terminals 70 each contain at least one of metals that are, for example, copper, nickel, gold, and tin. In addition, for example, each of the multilayer bodies may contain an alloy containing at least two of copper, nickel, gold, and tin.

For example, among the plurality of layers included in each of the external terminals 70, the outermost layer may be a layer that has an affinity for solder and that improves solder wettability. The layer having an affinity for solder may contain gold, tin, or the like. Alternatively, the layer having an affinity for solder may contain at least one of an alloy containing gold and an alloy containing tin. Note that each of the outermost layers may be a layer that suppresses oxidation of the corresponding external terminal 70.

In addition, for example, among the plurality of layers, the layer that is positioned in the middle may be a corrosion suppression layer. The corrosion suppression layer may contain, for example, nickel. Alternatively, the corrosion suppression layer may contain an alloy containing nickel.

Each of the external terminals does not need to be a multilayer body formed of a plurality of layers laminated together.

The external terminals do not need to be in contact with the first main surface 21 of the main body BD as long as they are connected to their respective vertical wirings 60.

The inductor component does not need to include any external terminal. In this case, an end portion of each of the vertical wirings, the end portion being opposite to the other end portion of the vertical wiring that is connected to the inductor wiring, is exposed to the outside.

It is not essential that the surface roughness of the first outer layer 31 be "about 2 µm" or less.

It is not essential that the surface roughness of the second outer layer 32 be "about 2 µm" or less.

The second outer layer 32 does not need to contain a black colorant as long as the shielding property of the second outer layer 32 can be higher than the shielding property of the first outer layer 31.

It is not necessary to set the content of the colorant per unit volume in the second outer layer 32 to be higher than the content of the colorant per unit volume in the first outer layer 31 as long as the shielding property of the second outer layer 32 can be higher than the shielding property of the first outer layer 31.

It is not necessary to set the shielding property of the second outer layer 32 to be higher than the shielding property of the first outer layer 31.

The second outer layer 32 does not need to be thinner than the first outer layer 31. For example, in the case where the inductor component includes a vertical wiring that extends from a portion in which the vertical wiring and the inductor wiring is connected to each other to the second main surface 22, the thickness Tl2 of the second outer layer 32 may preferably be approximately equal to the thickness Tl1 of the first outer layer 31, or the thickness Tl2 of the second outer layer 32 may preferably be larger than the thickness Tl1 of the first outer layer 31.

The thickness Tl1 of the first outer layer 31 may be set to be less than "about 3 µm" as long as the degree of surface irregularities of the surface 311 of the first outer layer 31 can be kept within an acceptable range.

The thickness Tl1 of the first outer layer 31 may be set to be larger than "about 10 µm" as long as the inductance of the inductor component 10 can be sufficiently ensured.

The average particle diameter of the magnetic powder contained in the magnetic layer 20 may be set to be larger than "about 5 µm" as long as the degree of surface irregularities of the side surfaces of the main body BD including the magnetic layer 20 can be kept within an acceptable range.

The thickness T1 of the main body BD in the inductor component 10 may be set to be larger than "about 0.3 mm".

The first outer layer 31 does not need to contain an inorganic filler.

The second outer layer 32 does not need to contain an inorganic filler.

The color of the first outer layer 31 may be the same as the color of the second outer layer 32.

The inductor component may have a configuration different from that of the inductor component 10 as long as the inductor component includes an inductor wiring, a vertical wiring connected to the inductor wiring, a first outer layer, and a second outer layer. For example, the inductor component may include a main body in which a first magnetic layer, an insulating layer, and a second magnetic layer are laminated in this order in the thickness direction X1. In this case, the inductor wiring may be sandwiched between the first magnetic layer and the insulating layer or may be sandwiched between the second magnetic layer and the insulating layer. In addition, the first magnetic layer itself may be a multilayer body formed of a plurality of layers laminated together. Similarly, the second magnetic layer itself may be a multilayer body formed of a plurality of layers laminated together. In the inductor component having such a configuration, a first main surface of the main body is formed of the first magnetic layer, and a second main surface of the main body is formed of the second magnetic layer.

The inductor component may have a configuration in which the inductor wiring is covered with an insulating layer.

The inductor component may have a configuration that does not include the insulating layer 50.

The inductor component may have a configuration in which the non-main surface 23 of the main body BD is covered with another outer layer as long as the first outer layer 31 and the second outer layer 32 respectively cover the first main surface 21 and the second main surface 22. The outer layer that covers the non-main surface 23 may contain a colorant or may not contain a colorant as long as it is a layer having an insulating property. It is preferable that a method for manufacturing such an inductor component have a step of forming an outer layer that covers the non-main surface 23 separately from the step of forming the first outer layer 31 onto the first main surface 21 and the step of forming the second outer layer 32 onto the second main surface 22.

The inductor component may be manufactured by another manufacturing method that does not use the semi-additive process. For example, the inductor component may be manufactured by using a sheet lamination method, a printing lamination method, or the like. The inductor wiring may be formed by a thin-film method such as sputtering or vapor deposition, a thick-film method such as printing or coating, or a plating method such as fully-additive plating or a subtractive plating.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor component comprising:
a main body that includes a magnetic layer and that has a first main surface and a second main surface;
an inductor wiring that is disposed in the main body; and
a vertical wiring that is connected to the inductor wiring and that extends from a portion in which the vertical wiring and the inductor wiring are connected to each other to the first main surface,
wherein the second main surface is located opposite to the first main surface with the inductor wiring interposed therebetween,
the first main surface is covered with a first outer layer having an insulating property,
the second main surface is covered with a second outer layer having an insulating property,
the first outer layer and the second outer layer each contain a colorant, and
the first outer layer has a color different from a color of the second outer layer.

2. The inductor component according to claim 1, wherein among side surfaces of the main body, only the first main surface is covered with the first outer layer.

3. The inductor component according to claim 1, wherein among side surfaces of the main body, only the second main surface is covered with the second outer layer.

4. The inductor component according to claim 1, wherein at least one of the first outer layer and the second outer layer contains an inorganic filler.

5. The inductor component according to claim 1, wherein a gap between the first main surface and the second main surface is 0.3 mm or less,
the magnetic layer contains, as magnetic powder, at least one of iron and an alloy containing iron, and
an average particle diameter of the magnetic powder is from 1 μm to 5 μm.

6. The inductor component according to claim 1, wherein a thickness of the first outer layer is from 3 μm to 10 μm.

7. The inductor component according to claim 1, wherein the second outer layer is thinner than the first outer layer.

8. The inductor component according to claim 1, wherein the second outer layer contains a black colorant.

9. The inductor component according to claim 1, further comprising:
an external terminal that is connected to the vertical wiring and exposed at the first outer layer,
wherein the external terminal is in contact with both the main body and the first outer layer.

10. The inductor component according to claim 9, wherein
the external terminal is a multilayer body including a plurality of layers laminated together, and
the multilayer body includes a layer in which a percentage of copper is 99 wt % or less and a percentage of nickel is 0.1 wt % or greater.

11. The inductor component according to claim 9, wherein
the external terminal is a multilayer body including a plurality of layers laminated together, and
the multilayer body includes a layer containing a substitutional catalyst.

12. The inductor component according to claim 1, wherein the colorant contained in the first outer layer is different from the colorant contained in the second outer layer.

13. An inductor component comprising:
a main body that includes a magnetic layer and that has a first main surface and a second main surface;
an inductor wiring that is disposed in the main body; and
a vertical wiring that is connected to the inductor wiring and that extends from a portion in which the vertical wiring and the inductor wiring are connected to each other to the first main surface,
wherein the second main surface is located opposite to the first main surface with the inductor wiring interposed therebetween,
the first main surface is covered with a first outer layer having an insulating property,
the second main surface is covered with a second outer layer having an insulating property,
the first outer layer and the second outer layer each contain a colorant, and
the colorant contained in the first outer layer is different from the colorant contained in the second outer layer.

14. The inductor component according to claim 13, wherein
among side surfaces of the main body, only the first main surface is covered with the first outer layer.

15. The inductor component according to claim 13, wherein
among side surfaces of the main body, only the second main surface is covered with the second outer layer.

16. An inductor component comprising:
a main body that includes a magnetic layer and that has a first main surface and a second main surface;
an inductor wiring that is disposed in the main body; and
a vertical wiring that is connected to the inductor wiring and that extends from a portion in which the vertical wiring and the inductor wiring are connected to each other to the first main surface,
wherein the second main surface is located opposite to the first main surface with the inductor wiring interposed therebetween,
the first main surface is covered with a first outer layer having an insulating property,
the second main surface is covered with a second outer layer having an insulating property,
the first outer layer and the second outer layer each contain a colorant, and
a shielding property of the second outer layer is higher than a shielding property of the first outer layer.

17. An inductor component comprising:
a main body that includes a magnetic layer and that has a first main surface and a second main surface;
an inductor wiring that is disposed in the main body; and
a vertical wiring that is connected to the inductor wiring and that extends from a portion in which the vertical wiring and the inductor wiring are connected to each other to the first main surface,
wherein the second main surface is located opposite to the first main surface with the inductor wiring interposed therebetween,
the first main surface is covered with a first outer layer having an insulating property,
the second main surface is covered with a second outer layer having an insulating property,
the first outer layer and the second outer layer each contain a colorant, and a content of the colorant per unit volume in the second outer layer is larger than a content of the colorant per unit volume in the first outer layer.

18. An inductor component comprising:

a main body that includes a magnetic layer and that has a first main surface and a second main surface;

an inductor wiring that is disposed in the main body; and a vertical wiring that is connected to the inductor wiring and that extends from a portion in which the vertical wiring and the inductor wiring are connected to each other to the first main surface, wherein the second main surface is located opposite to the first main surface with the inductor wiring interposed therebetween, the first main surface is covered with a first outer layer having an insulating property, the second main surface is covered with a second outer layer having an insulating property, the first outer layer and the second outer layer each contain a colorant, and at least one of the first outer layer and the second outer layer has a surface roughness of 2 μm or less.

* * * * *